(12) United States Patent
Campbell (10) Patent No.: US 10,637,527 B2
(45) Date of Patent: Apr. 28, 2020

(54) SEQUENTIALLY SWITCHED BULK ACOUSTIC WAVE (BAW) DELAY LINE CIRCULATOR

(71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/167,731

(22) Filed: Oct. 23, 2018

(65) Prior Publication Data

US 2019/0393924 A1 Dec. 26, 2019

Related U.S. Application Data

(60) Provisional application No. 62/688,117, filed on Jun. 21, 2018.

(51) Int. Cl.
*H04B 1/46* (2006.01)
*H04B 1/48* (2006.01)
(Continued)

(52) U.S. Cl.
CPC .............. *H04B 1/48* (2013.01); *H01L 23/66* (2013.01); *H01L 27/1203* (2013.01);
(Continued)

(58) Field of Classification Search
CPC .................. H04B 1/48; H01L 27/1203; H01L 2223/6677; H03H 9/30; H03H 9/706; H03H 9/725
(Continued)

(56) References Cited

U.S. PATENT DOCUMENTS 5,721,783 A * 2/1998 Anderson .............. H04B 1/385
381/328
8,600,200 B1 * 12/2013 Rakich .................. G02F 1/125
385/1

(Continued)

OTHER PUBLICATIONS

Biedka, Mathew, et al., "Circulators for Ultra-Wide Band RF Systems with Sequentially-Switched Delay Lines (SSDL)," GomacTech, 2018, pp. 123-127.

(Continued)

*Primary Examiner* — Edward F Urban
*Assistant Examiner* — Max Mathew
(74) *Attorney, Agent, or Firm* — Withrow & Terranova, P.L.L.C.

(57) ABSTRACT

A sequentially switched bulk acoustic wave (BAW) delay line circulator is disclosed herein. A circulator circuit is implemented with semiconductor components in order to provide a compact, low cost solution for simultaneous signal transmission and reception over a single antenna. For example, the circulator circuit can include a transmit (TX) port, a receive (RX) port, and an antenna port. Antenna switching circuitry selectively couples the antenna port to two or more BAW delay lines, and TX/RX switching circuitry selectively couples the BAW delay lines to the TX port or the RX port. The BAW delay lines function as memory to store TX and RX signals long enough for the antenna switching circuitry, a TX switch, and a RX switch to be switched in sequence and route the TX signals from the TX port to the antenna port and route the RX signals from the antenna port to the RX port.

19 Claims, 8 Drawing Sheets (51) Int. Cl.
H03H 9/30 (2006.01)
H03H 9/70 (2006.01)
H03H 9/205 (2006.01)
H01L 23/66 (2006.01)
H01L 27/12 (2006.01)

(52) U.S. Cl.
CPC ............ *H03H 9/205* (2013.01); *H03H 9/30* (2013.01); *H03H 9/706* (2013.01); *H01L 2223/6677* (2013.01)

(58) Field of Classification Search
USPC .......................................... 455/82
See application file for complete search history.

(56) References Cited

U.S. PATENT DOCUMENTS

| | | | | |
|---|---|---|---|---|
| 2008/0203721 | A1* | 8/2008 | Petersson | H04M 1/0202 283/99 |
| 2009/0322479 | A1* | 12/2009 | Fukuda | G06K 7/0008 340/10.1 |
| 2013/0225247 | A1* | 8/2013 | Kim | H04M 1/0202 455/575.1 |
| 2014/0266399 | A1* | 9/2014 | Corman | H03K 17/002 327/415 |
| 2015/0054698 | A1* | 2/2015 | Kerr | H01Q 5/328 343/745 |
| 2016/0054440 | A1* | 2/2016 | Younis | G01S 13/753 342/5 |
| 2016/0182118 | A1* | 6/2016 | Lam | H03H 2/005 455/78 |
| 2017/0331168 | A1 | 11/2017 | Wang | |

OTHER PUBLICATIONS

Biedka, Mathew, et al., "Ultra-Wide Band Circulator through Sequentially-Switched Delay Lines (SSDL)," GomacTech, 2017, pp. 690-692.

Biedka, Mathew, et al., "Ultra-Wide Band Non-reciprocity through Sequentially-Switched Delay Lines," Scientific Reports, Jan. 6, 2017, 16 pages.

Biedka, Mathew, et al., "Simultaneous Transmission and Receive (STAR) from DC to RF," International Microwave Symposium, Jun. 2017, Honolulu, Hawaii, pp. 1774-1777.

* cited by examiner

SEQUENTIALLY SWITCHED BULK ACOUSTIC WAVE (BAW) DELAY LINE CIRCULATOR

RELATED APPLICATIONS

This application claims the benefit of provisional patent application serial number 62/688,177, filed Jun. 21, 2018, the disclosure of which is incorporated herein by reference in its entirety.

FIELD OF THE DISCLOSURE

The present disclosure relates to radio frequency (RF) circulators, and more particularly to semiconductor-based RF circulators.

BACKGROUND

In radio frequency (RF) transceiver systems, a magnetic circulator is frequently used to enable simultaneous signal transmission and reception over a single antenna. The magnetic circulator routes the signals between a transmit (TX) port, an antenna port, and a receive (RX) port while providing isolation between the TX port and the RX port. The magnetic circulator includes a permanent magnet which causes signals to pass through its material along one direction, such that signals travel from the TX port to the antenna port and from the antenna port to the RX port.

The size of a magnetic circulator is inversely proportional to frequency of the signals which propagate through it and can become very large for lower frequency applications. Accordingly, magnetic circulators in wide band RF transceivers can be bulky and expensive due to the use of larger permanent magnets.

SUMMARY

The present disclosure relates to a sequentially switched bulk acoustic wave (BAW) delay line circulator. A circulator circuit is implemented with semiconductor components in order to provide a compact, low cost solution for simultaneous signal transmission and reception over a single antenna. For example, the circulator circuit can include a transmit (TX) port, a receive (RX) port, and an antenna port. Antenna switching circuitry selectively couples the antenna port to two or more delay lines, and a TX switch and a RX switch selectively couple the delay lines to the TX port and RX port respectively. The delay lines function as memory to store TX and RX signals long enough for the antenna switching circuitry, the TX switch, and the RX switch to be switched in sequence and route the TX signals from the TX port to the antenna port and route the RX signals from the antenna port to the RX port.

Each of the delay lines is a BAW delay line, which includes a piezoelectric film between opposing conductive layers, and may be a BAW resonator. The BAW delay lines provide a compact memory which delays the respective TX and RX signals at least as long as the switching time of the antenna switching circuitry, the TX switch, and the RX switch. In addition, the BAW delay lines can be manufactured on a common semiconductor substrate for improved performance, manufacture, and size of the circulator circuit.

In an exemplary aspect, a semiconductor-based circulator circuit is provided. The semiconductor-based circulator circuit includes a TX port, a RX port, and an antenna port. The semiconductor-based circulator circuit also includes a first BAW delay line, a second BAW delay line, and antenna switching circuitry coupled between the antenna port, the first BAW delay line, and the second BAW delay line. The antenna switching circuitry is configured to selectively connect the antenna port to the first BAW delay line or the second BAW delay line. The semiconductor-based circulator also includes TX/RX switching circuitry configured to selectively connect the TX port to the first BAW delay line or the second BAW delay line and selectively connect the RX port to the first BAW delay line or the second BAW delay line.

Another exemplary aspect relates to a radio frequency (RF) transceiver. The RF transceiver includes TX processing circuitry, RX processing circuitry, and an antenna. The RF transceiver also includes a circulator circuit configured to simultaneously exchange a RX signal between the antenna and the RX processing circuitry and exchange a TX signal between the TX processing circuitry and the antenna. The circulator circuit includes a first BAW delay line, a second BAW delay line, and antenna switching circuitry coupled between the antenna, the first BAW delay line, and the second BAW delay line. The circulator circuit also includes TX/RX switching circuitry coupled between the TX processing circuitry, the RX processing circuitry, the first BAW delay line, and the second BAW delay line.

Another exemplary aspect relates to a method of operating a RF transceiver. The method includes the operations of coupling TX processing circuitry to a first BAW delay line and coupling an antenna to a second BAW delay line. The method also includes after a first delay, coupling the antenna to the first BAW delay line and coupling receive (RX) processing circuitry to the second BAW delay line.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a sequentially switched bulk acoustic wave (BAW) delay line circulator. A circulator circuit is implemented with semiconductor components in order to provide a compact, low cost solution for simultaneous signal transmission and reception over a single antenna. For example, the circulator circuit can include a transmit (TX) port, a receive (RX) port, and an antenna port. Antenna switching circuitry selectively couples the antenna port to two or more delay lines, and a TX switch and a RX switch selectively couple the delay lines to the TX port and RX port respectively. The delay lines function as memory to store TX and RX signals long enough for the antenna switching circuitry, the TX switch, and the RX switch to be switched in sequence and route the TX signals from the TX port to the antenna port and route the RX signals from the antenna port to the RX port.

Each of the delay lines is a BAW delay line, which includes a piezoelectric film between opposing conductive layers, and may be a BAW resonator. The BAW delay lines provide a compact memory which delays the respective TX and RX signals at least as long as the switching time of the antenna switching circuitry, the TX switch, and the RX switch. In addition, the BAW delay lines can be manufactured on a common semiconductor substrate for improved performance, manufacture, and size of the circulator circuit.

Figure 1:
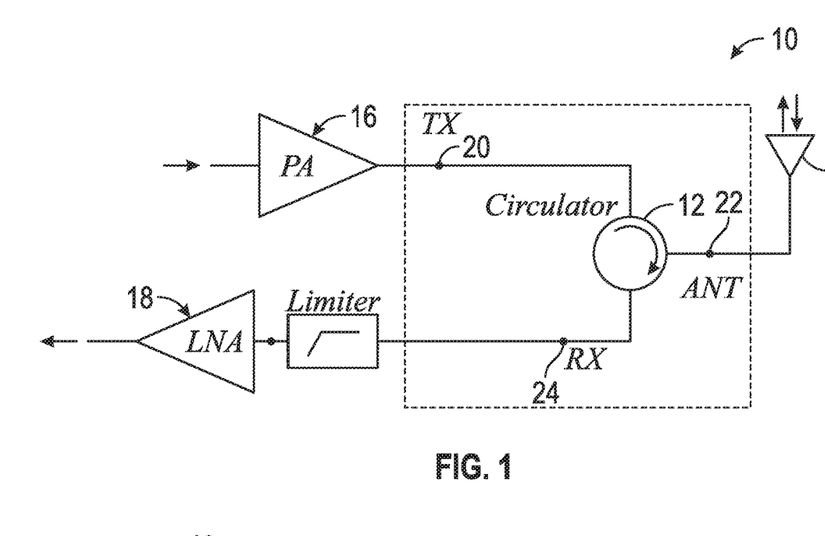
FIG. 1 illustrates an exemplary block diagram of a full duplex transceiver, with a circulator circuit coupling an antenna to transmit (TX) circuitry and receive (RX) circuitry.

In this regard, FIG. 1 illustrates an exemplary block diagram of a full duplex transceiver 10, with a circulator circuit 12 coupling an antenna 14 to TX processing circuitry 16 and RX processing circuitry 18. The "full duplex" transceiver 10 is able to transmit and receive simultaneously with the single antenna 14. The circulator circuit 12 routes signals between a TX port 20 (coupled to the TX processing circuitry 16), an antenna port 22 (coupled to the antenna 14), and a RX port 24 (coupled to the RX processing circuitry 18) while providing isolation between the TX port 20 and the RX port 24. For illustrative purposes, the circulator circuit 12 is diagrammed as routing signals which enter one of the ports 20, 22, 24 to the next clockwise port 20, 22, 24 only. Thus TX signals which enter the TX port 20 are routed to the antenna port 22, and RX signals which enter the antenna port 22 are routed to the RX port 24. In general, the circulator circuit 12 does not perfectly route the signals to only the next clockwise port 20, 22, 24, but can provide a desired amount of isolation between the TX port 20 and the RX port 24 with low insertion loss.

The TX processing circuitry 16 processes and forwards one or more radio frequency (RF) transmit signals (e.g., TX signals) to the circulator circuit 12. In an exemplary aspect, the TX processing circuitry 16 includes a power amplifier (PA), an analog to digital converter, modulation circuitry, and/or additional processing circuitry to generate the TX signal(s) to be propagated by the antenna 14.

The RX processing circuitry 18 receives and processes one or more RF receive signals (e.g., RX signals) from the antenna 14 via the circulator circuit 12. In an exemplary aspect, the RX processing circuitry 18 includes a low noise amplifier (LNA), a limiter or other signal filter (e.g., a low pass filter, a high pass filter, a notch filter), demodulation circuitry, an analog to digital converter, and/or additional processing circuitry to condition and process the RX signal (s).

As described above, traditional magnetic circulators are bulky and expensive. Aspects disclosed herein relate to a transceiver 10 (e.g., a RF transceiver 10) which includes a circulator circuit 12 based on a sequentially switched delay line (SSDL) architecture having BAW delay lines. A circulator circuit 12 based on the SSDL architecture is a semiconductor-based device which uses delay lines as memory to store TX signals and RX signals long enough for sequentially activated switches to route the TX signals from the TX port 20 to the antenna port 22 and route the RX signals from the antenna port 22 to the RX port 24. BAW delay lines provide more compact delay lines with higher signal performance.

Operation of an exemplary SSDL circulator circuit 12 having BAW delay lines is further described with respect to FIGS. 2A-2H. Exemplary BAW delay line-based circulator circuits 12 are further described with respect to FIGS. 3A-5B. Exemplary response characteristics of the BAW delay line-based circulator circuit 12 are further described with respect to FIG. 6.

FIGS. 2A-2H illustrate operation of the exemplary BAW delay line-based circulator circuit 12 as signals enter the TX port 20 and antenna port 22 simultaneously. The circulator circuit 12 includes a first BAW delay line 26 and a second BAW delay line 28. Antenna switching circuitry 30 is coupled between the antenna port 22, the first BAW delay line 26, and the second BAW delay line 28. The antenna switching circuitry 30 is configured to selectively connect the antenna port 22 to the first BAW delay line 26 or the second BAW delay line 28.

TX/RX switching circuitry 32 is coupled between the TX port 20, the RX port 24, the first BAW delay line 26, and the second BAW delay line 28. The TX/RX switching circuitry 32 is configured to selectively connect the TX port 20 to the first BAW delay line 26 or the second BAW delay line 28 and selectively connect the RX port 24 to the first BAW delay line 26 or the second BAW delay line 28. The TX/RX switching circuitry 32 includes a TX switch 34 and a RX switch 36. The TX switch 34 and the RX switch 36 are configured to be simultaneously switched. In this regard, when the TX switch 34 couples the TX port 20 to the first BAW delay line 26, the RX switch 36 couples the RX port 24 to the second BAW delay line 28, as illustrated in FIGS. 2A-2E. In addition, when the TX switch 34 couples the TX port 20 to the second BAW delay line 28, the RX switch 36 couples the RX port 24 to the first BAW delay line 26.

The first BAW delay line 26 and the second BAW delay line 28 function as delay lines between the antenna switching circuitry 30 and the TX/RX switching circuitry 32. Accordingly, each of the first BAW delay line 26 and the second BAW delay line 28 introduce a signal delay time τ to signals passing through the circulator circuit 12. The signal delay time τ serves as memory of the signals while the antenna switching circuitry 30 and the TX/RX switching circuitry 32 are switched in sequence and route the signals between the appropriate ports 20, 22, 24. In an exemplary aspect, the signal delay time τ is greater than a switching time of the antenna switching circuitry 30 and the TX/RX switching circuitry 32 (e.g., the longest switching time of the antenna switching circuitry 30, the TX switch 34, and the RX switch 36).

The first BAW delay line 26 and the second BAW delay line 28 is configured to introduce the signal delay time τ within a target signal frequency range. In an exemplary aspect, the first BAW delay line 26 and/or the second BAW delay line 28 can generate a greater signal delay time τ than a switching time of the antenna switching circuitry 30 and the TX/RX switching circuitry 32. The BAW delay lines 26, 28 can also be built on a common semiconductor substrate with the antenna switching circuitry 30 and the TX/RX switching circuitry 32, resulting in a compact circulator circuit 12. In some examples, the BAW delay lines 26, 28 include a BAW resonator, though this is not required.

In greater detail, FIGS. 2A-2H illustrate the sequential switching of the circulator circuit 12 to route a periodically pulsed TX signal, with a period of T, which enters the TX port 20. The sequential switching of the circulator circuit 12 also routes a periodically pulsed RX signal, with a period of T, which enters the antenna port 22 at a same time.

Figure 2A:
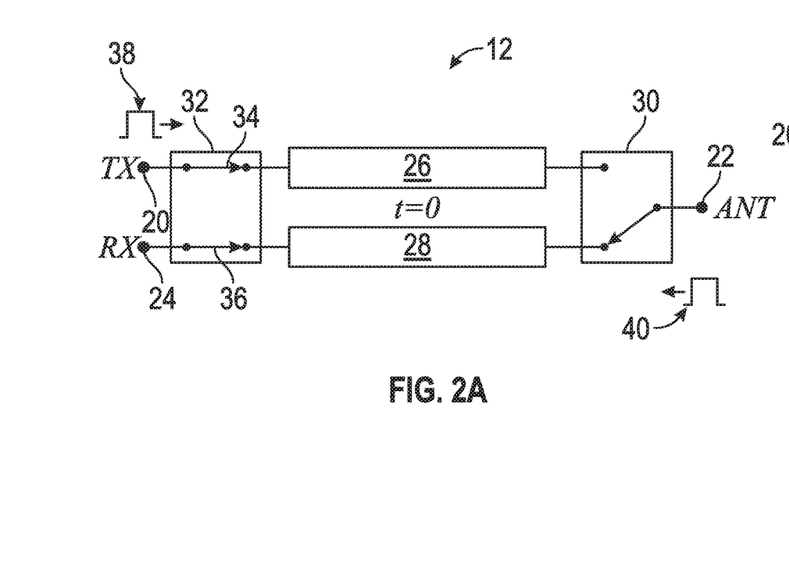
FIGS. 2A-2H illustrate operation of an exemplary bulk acoustic wave (BAW) delay line-based circulator circuit as signals enter the TX port and antenna port simultaneously.
Figure 2B:
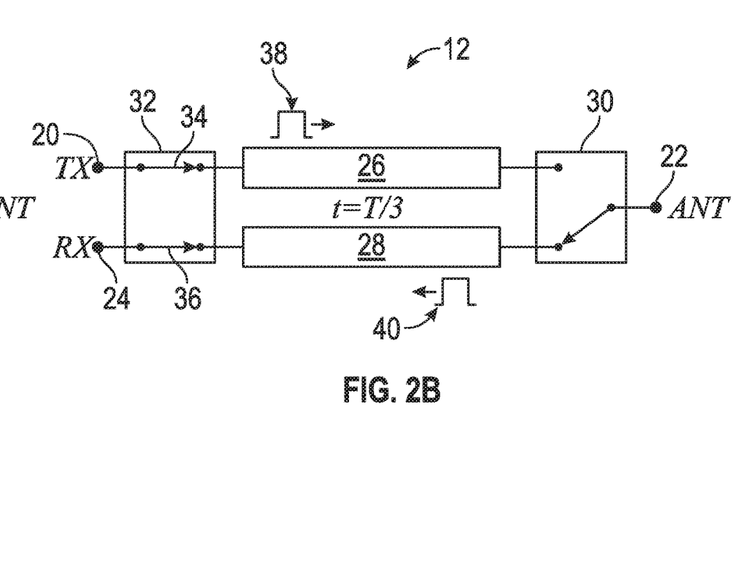

In this regard, FIG. 2A depicts the circulator circuit 12 at a first time t=0, as a first pulse 38 of the TX signal enters the TX port 20 and a first pulse 40 of the RX signal enters the antenna port 22. At the first time t=0, the TX/RX switching circuitry 32 (e.g., the TX switch 34) couples the TX port 20 to the first BAW delay line 26. In addition, the antenna switching circuitry 30 couples the antenna port 22 to the second BAW delay line 28. The first pulse 38 of the TX signal is accordingly routed through the first BAW delay line 26, as depicted in FIG. 2B at time t=T/3. The first pulse 38 of the TX signal travels through (e.g., is stored in) the first BAW delay line 26 during the signal delay time τ. Similarly, the first pulse 40 of the RX signal travels through (e.g., is stored in) the second BAW delay line 28 during the signal delay time τ.

Figure 2C:
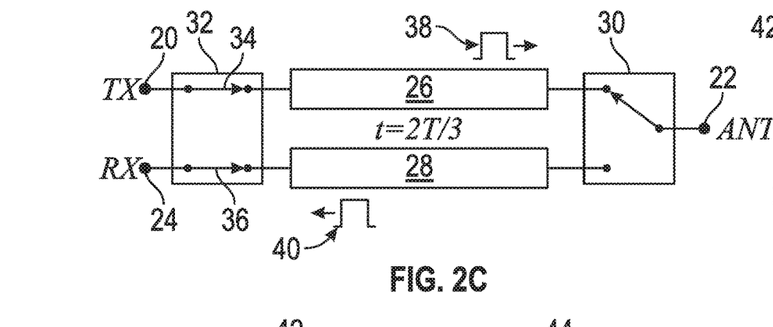
Figure 2D:
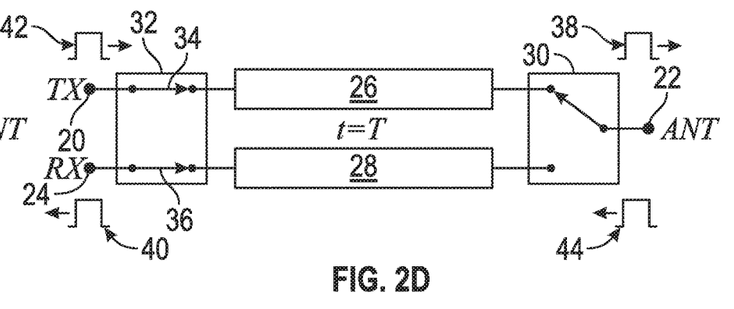

Continuing to FIG. 2C at time t=2T/3, while the first pulses 38, 40 travel through the respective BAW delay lines 26, 28, the antenna switching circuitry 30 changes and couples the antenna port 22 to the first BAW delay line 26. In this manner, as depicted in FIG. 2D, by time t=T the signal delay time τ of the first BAW delay line 26 has enabled the antenna switching circuitry 30 to properly route the first pulse 38 of the TX signal (e.g., to be radiated by the antenna 14 of FIG. 1). The first pulse 40 of the RX signal is routed to the RX port 24 (e.g., to be processed by the RX processing circuitry 18 of FIG. 1) without changing the TX/RX switching circuitry 32 (the RX switch 36 already coupling the RX port 24 to the second BAW delay line 28).

In addition, at time t=T (FIG. 2D) a second pulse 42 of the TX signal enters the TX port 20 and a second pulse 44 of the RX signal enters the antenna port 22. Because the TX/RX switching circuitry 32 couples the TX port 20 to the first BAW delay line 26, the second pulse 42 of the TX signal travels through (e.g., is stored in) the first BAW delay line 26. Further, because the antenna switching circuitry 30 couples the antenna port 22 to the first BAW delay line 26, the second pulse 44 of the RX signal travels through (e.g., is stored in) the first BAW delay line 26. Thus, continuing to FIG. 2E at time t=4T/3, both second pulses 42, 44 travel through the first BAW delay line 26 during the signal delay time τ.

Figures 2E, 2G:
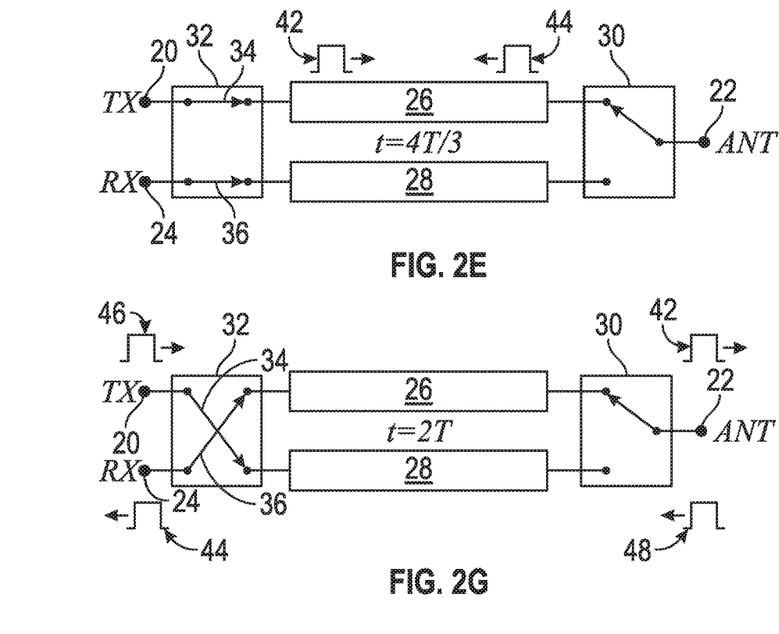
Figure 2F:
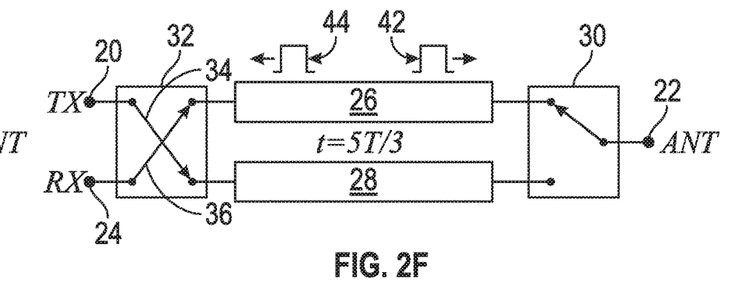

Continuing to FIG. 2F at time t=5T/3, while the second pulses 42, 44 travel through the first BAW delay line 26, the TX/RX switching circuitry 32 changes. The TX/RX switching circuitry 32 simultaneously switches the TX switch 34 to couple the TX port 20 to the second BAW delay line 28 and switches the RX switch 36 to couple the RX port 24 to the first BAW delay line 26. In this manner, as depicted in FIG. 2G, by time t=2T the signal delay time τ of the first BAW delay line 26 has enabled the TX/RX switching circuitry 32 to properly route the second pulse 44 of the RX signal (e.g., to be processed by the RX processing circuitry 18 of FIG. 1). The second pulse 42 of the TX signal is routed to the antenna port 22 (e.g., to be radiated by the antenna 14 of FIG. 1) without changing the antenna switching circuitry 30 (the antenna switching circuitry 30 already coupling the antenna port 22 to the first BAW delay line 26).

Figure 2H:
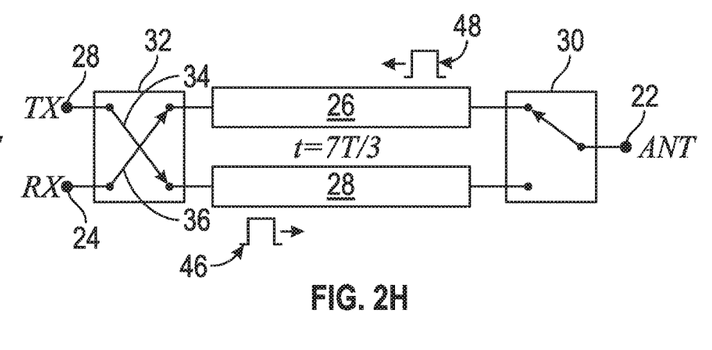

In addition, at time t=2T (FIG. 2G) a third pulse 46 of the TX signal enters the TX port 20 and a third pulse 48 of the RX signal enters the antenna port 22. Because the TX/RX switching circuitry 32 couples the TX port 20 to the second BAW delay line 28, the third pulse 46 of the TX signal travels through (e.g., is stored in) the second BAW delay line 28 during the signal delay time τ as depicted in FIG. 2H at time t=7T/3. Further, because the antenna switching circuitry 30 couples the antenna port 22 to the first BAW delay line 26, the third pulse 48 of the RX signal travels through (e.g., is stored in) the first BAW delay line 26 during the signal delay time τ.

In order for the process described above with respect to FIGS. 2A-2H to properly route the TX signals and RX signals, the antenna switching circuitry 30 and the TX/RX switching circuitry 32 completely change state before each pulse 38, 40, 42, 44, 46, 48 to be routed arrives. In other words, the signal delay time τ of the BAW delay lines 26, 28 needs to be longer than the switching time of the antenna switching circuitry 30 and the TX/RX switching circuitry 32. Other SSDL architectures have been proposed based on resistive delay lines (e.g., through transmission lines); however, these architectures require excessively large delay lines with lower signal performance.

In this regard, it should be understood that the switch timing (e.g., T/3, 4T/3, etc.) of the circulator circuit 12 illustrated in FIGS. 2A-2H is illustrative with respect to pulsed TX and RX signals with a period of T. In other examples, the timing of the switching may vary so long as each of the antenna switching circuitry 30 and the TX/RX switching circuitry 32 completes switching before a next signal pulse enters the respective switching circuitry.

In aspects disclosed herein, the BAW delay lines 26, 28 provide a compact SSDL delay line with higher signal performance. The exemplary operation of the circulator circuit 12 illustrated in FIGS. 2A-2H can be extended to continuous time signals, such as in the exemplary BAW delay line-based circulator circuits 12 described with respect to FIGS. 3A-3D. Design and implementation of exemplary BAW delay line-based circulator circuits 12 are described with respect to FIGS. 4-5B.

Figure 3A:
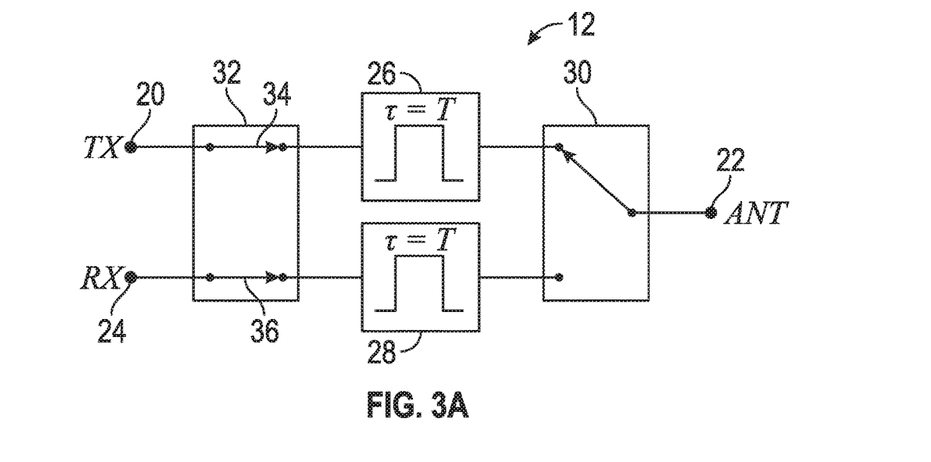
FIG. 3A illustrates another exemplary BAW delay line-based circulator circuit having a three-port, two delay line configuration.

FIG. 3A illustrates another exemplary BAW delay line-based circulator circuit 12 having a three-port, two delay line configuration. Accordingly, the circulator circuit 12 includes a first BAW delay line 26 and a second BAW delay line 28 between antenna switching circuitry 30 and TX/RX switching circuitry 32.

The antenna switching circuitry 30 is configured to selectively connect the antenna port 22 to the first BAW delay line 26 or the second BAW delay line 28. The TX/RX switching circuitry 32 includes a simultaneously switched TX switch 34 and RX switch 36. The TX switch 34 selectively couples the TX port 20 to the first BAW delay line 26 or the second BAW delay line 28. The RX switch 36 is switched simultaneously with the TX switch 34, such that the RX switch 36 couples the RX port 24 to the second BAW delay line 28 when the TX switch 34 couples the TX port 20 to the first BAW delay line 26. The RX switch 36 also couples the RX port 24 to the first BAW delay line 26 when the TX switch 34 couples the TX port 20 to the second BAW delay line 28. The circulator circuit 12 is configured to route the TX and RX signals between the appropriate ports 20, 22, 24 by simultaneously switching the antenna switching circuitry 30 and the TX/RX switching circuitry 32, such as in the manner described above with respect to FIGS. 2A-2H.

Figure 3B:
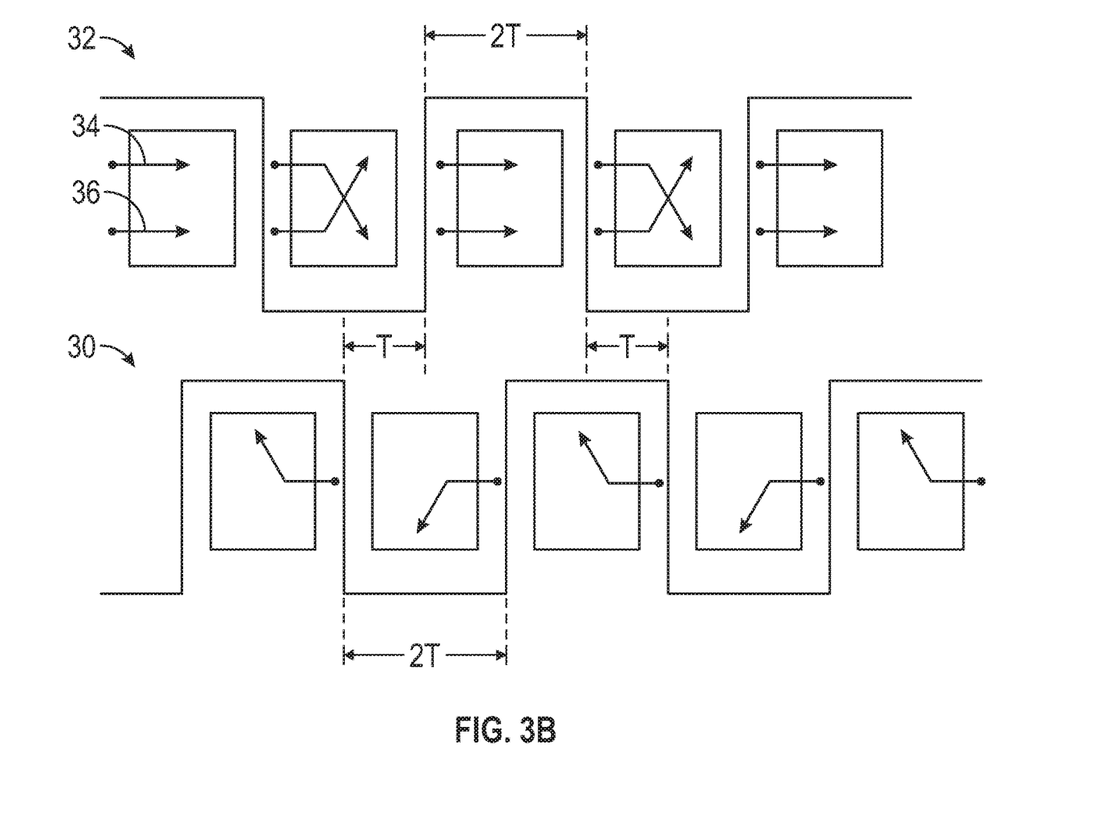
FIG. 3B illustrates an exemplary operation of the antenna switching circuitry and the TX/RX switching circuitry of FIG. 3A for continuous time signals.

FIG. 3B illustrates an exemplary operation of the antenna switching circuitry 30 and the TX/RX switching circuitry 32 of FIG. 3A for continuous time signals. As depicted in FIG. 3B, the signal delay time τ=T for each of the BAW delay lines 26, 28. Each of the antenna switching circuitry 30 and the TX/RX switching circuitry 32 changes position at a rate of twice the signal delay time (2T). The switching of the TX/RX switching circuitry 32 is offset from the antenna switching circuitry 30 by one signal delay time (T). A switching time of the antenna switching circuitry 30, the TX switch 34, and the RX switch 36 is less than the signal delay time (T), such that switching completes while the next signal to be routed propagates through the BAW delay line 26, 28.

Figure 3C:
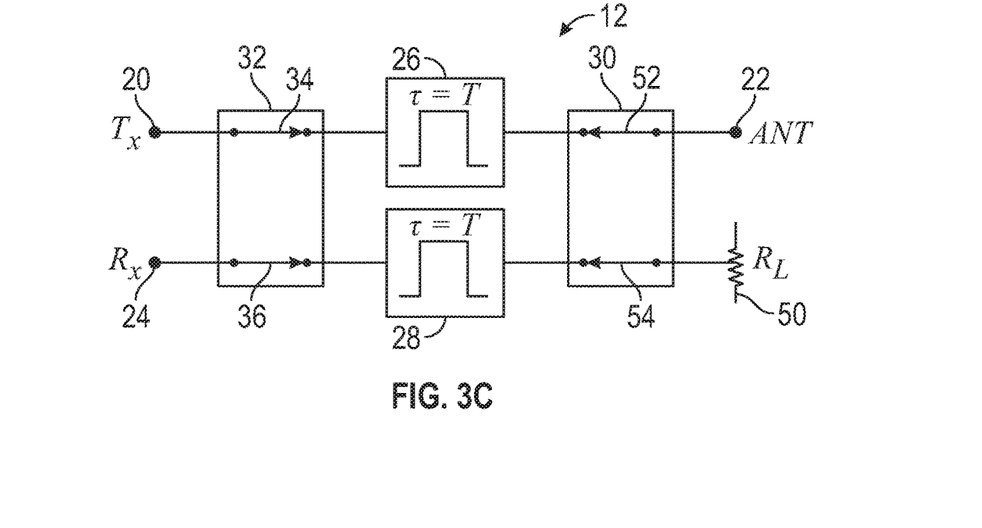
FIG. 3C illustrates an exemplary BAW delay line-based circulator circuit having a four-port, two delay line configuration.

FIG. 3C illustrates an exemplary BAW delay line-based circulator circuit 12 having a four-port, two delay line configuration. Accordingly, the circulator circuit 12 includes a first BAW delay line 26 and a second BAW delay line 28 between antenna switching circuitry 30 and TX/RX switching circuitry 32. In contrast with the exemplary circulator circuit 12 of FIG. 3A, the antenna switching circuitry 30 is coupled between the first BAW delay line 26, the second BAW delay line 28, the antenna port 22, and a load impedance 50.

The antenna switching circuitry 30 includes a simultaneously switched first antenna switch 52 and second antenna switch 54. The first antenna switch 52 selectively couples the antenna port 22 to the first BAW delay line 26 or the second BAW delay line 28. The second antenna switch 54 is switched simultaneously with the first antenna switch 52, such that the second antenna switch 54 couples the load impedance 50 to the second BAW delay line 28 when the first antenna switch 52 couples the antenna port 22 to the first BAW delay line 26. The second antenna switch 54 also couples the load impedance 50 to the first BAW delay line 26 when the first antenna switch 52 couples the antenna port 22 to the second BAW delay line 28.

The load impedance 50 can improve isolation between the TX port 20 and the RX port 24 by providing a path to ground and preventing signals reflected by the isolated port 20, 24 from re-entering the circulator circuit 12. The value of the load impedance 50 can be set to optimize the isolation of the TX port 20 and the RX port 24. The load impedance 50 can be a resistive load, a capacitive load, an inductive load, and/or an active load. In some cases the load impedance 50 can be omitted and the second antenna switch 54 can instead provide a direct path to ground.

Figure 3D:
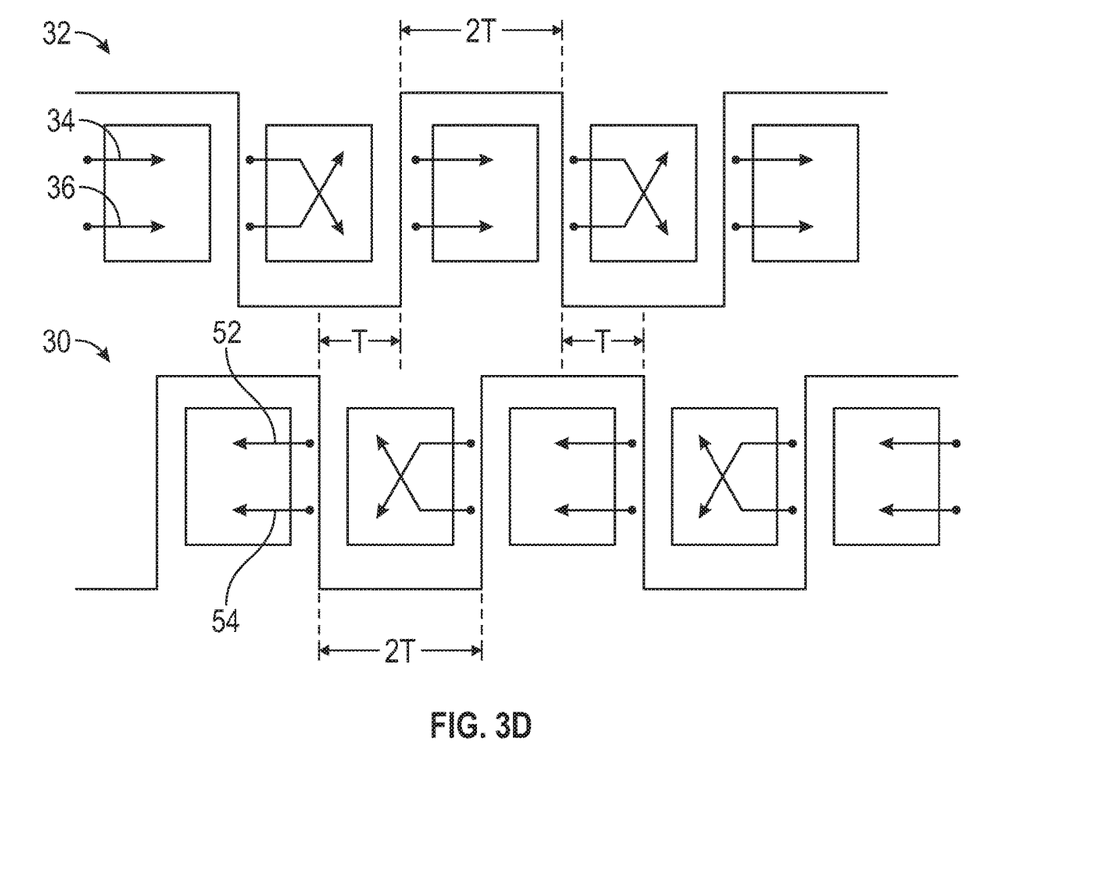
FIG. 3D illustrates an exemplary operation of the antenna switching circuitry and the TX/RX switching circuitry of FIG. 3C for continuous time signals.

FIG. 3D illustrates an exemplary operation of the antenna switching circuitry 30 and the TX/RX switching circuitry 32 of FIG. 3C for continuous time signals. As depicted in FIG. 3D, the signal delay time τ=T for each of the BAW delay lines 26, 28. Each of the antenna switching circuitry 30 and the TX/RX switching circuitry 32 changes position at a rate of twice the signal delay time (2T). The switching of the TX/RX switching circuitry 32 is offset from the antenna switching circuitry 30 by one signal delay time (T). A switching time of the first antenna switch 52, the second antenna switch 54, the TX switch 34, and the RX switch 36 is less than the signal delay time (T), such that switching completes while the next signal to be routed propagates through the BAW delay line 26, 28.

Figure 4:
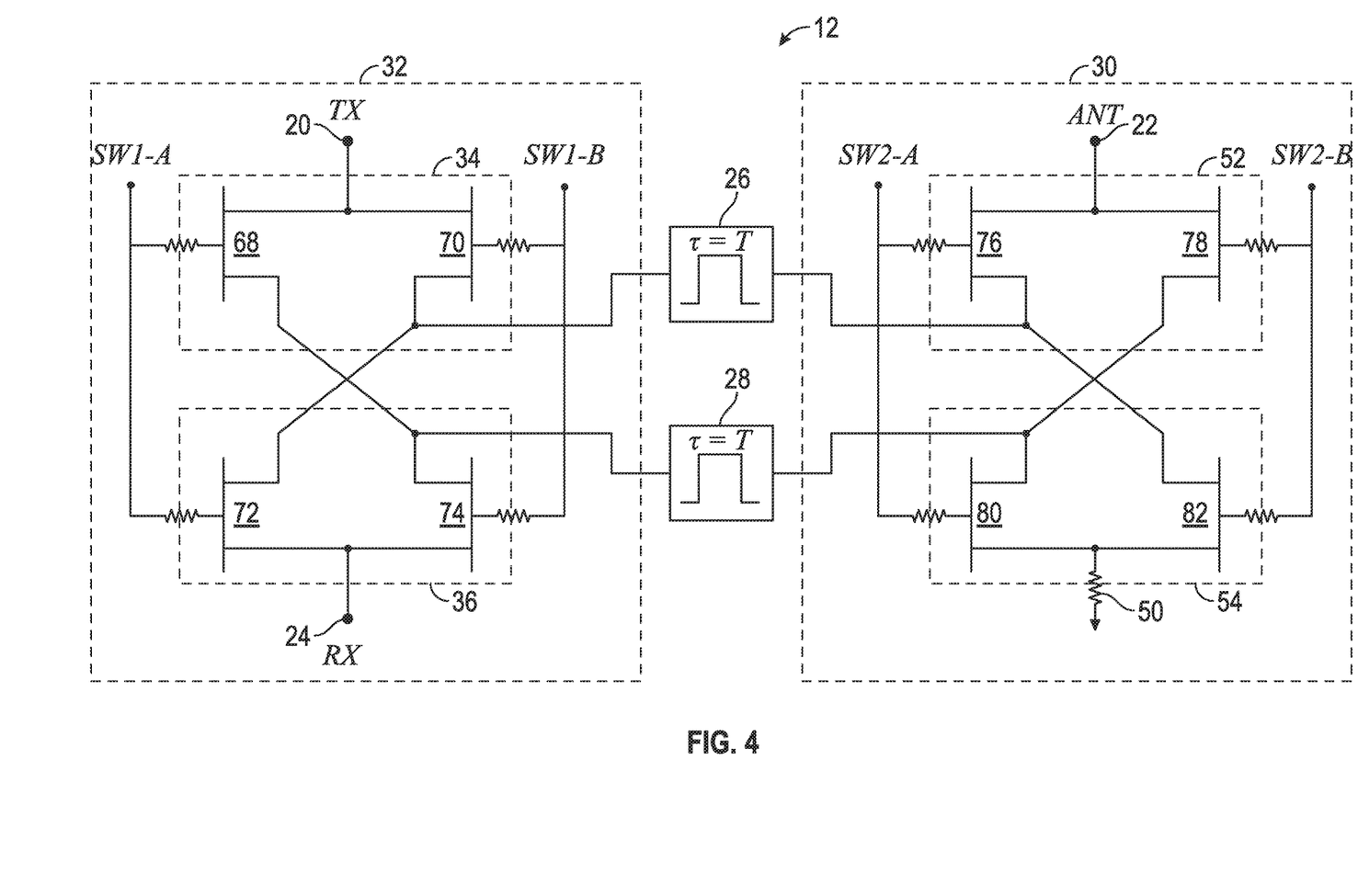
FIG. 4 illustrates a circuit diagram for the exemplary BAW delay line-based circulator circuit of FIG. 3C.

FIG. 4 illustrates a circuit diagram for the exemplary BAW delay line-based circulator circuit 12 of FIG. 3C. The circulator circuit 12 includes the first BAW delay line 26 and the second BAW delay line 28 between the antenna switching circuitry 30 and the TX/RX switching circuitry 32. In greater detail, the TX/RX switching circuitry 32 includes the simultaneously switched TX switch 34 and RX switch 36. The TX switch 34 selectively couples the TX port 20 to the first BAW delay line 26 or the second BAW delay line 28. The RX switch 36 selectively couples the RX port 24 to the first BAW delay line 26 or the second BAW delay line 28.

The TX switch 34 further includes a first TX switching element 68 and a second TX switching element 70, each of which may be a metal-oxide-semiconductor field-effect transistor (MOSFET) or another appropriate transistor. The first TX switching element 68 is coupled between the TX port 20 and the second BAW delay line 28, with its gate being coupled to a switching control signal SW1-A. The second TX switching element 70 is coupled between the TX port 20 and the first BAW delay line 26, with its gate being coupled to a switching control signal SW1-B.

The RX switch 36 further includes a first RX switching element 72 and a second RX switching element 74, each of which may be a MOSFET or another appropriate transistor. The first RX switching element 72 is coupled between the RX port 24 and the first BAW delay line 26, with its gate being coupled to the switching control signal SW1-A. The second RX switching element 74 is coupled between the RX port 24 and the second BAW delay line 28, with its gate being coupled to the switching control signal SW1-B.

The switching control signals SW1-A and SW1-B enable simultaneous switching of the TX switch 34 and the RX switch 36. Generally, the switching control signal SW1-B is a logical inverse of the switching control signal SW1-A (with logic high being above a switching threshold of the switching elements 68, 70, 72, 74 and logic low being below the switching threshold). In this regard, when the switching control signal SW1-A is high and the switching control signal SW1-B is low, the first TX switching element 68 and the first RX switching element 72 are active while the second TX switching element 70 and the second RX switching element 74 are inactive. Accordingly, the TX switch 34 couples the TX port 20 to the second BAW delay line 28 and the RX switch 36 couples the RX port 24 to the first BAW delay line 26.

When the switching control signal SW1-B is high and the switching control signal SW1-A is low, the second TX switching element 70 and the second RX switching element 74 are active while the first TX switching element 68 and the first RX switching element 72 are inactive. Accordingly, the TX switch 34 couples the TX port 20 to the first BAW delay line 26 and the RX switch 36 couples the RX port 24 to the second BAW delay line 28.

The antenna switching circuitry 30 includes the simultaneously switched first antenna switch 52 and second antenna switch 54. The first antenna switch 52 selectively couples the antenna port 22 to the first BAW delay line 26 or the second BAW delay line 28. The second antenna switch 54 selectively couples the load impedance 50 to the first BAW delay line 26 or the second BAW delay line 28.

The first antenna switch 52 further includes a first antenna switching element 76 and a second antenna switching element 78, each of which may be a MOSFET or another appropriate transistor. The first antenna switching element 76 is coupled between the antenna port 22 and the first BAW delay line 26, with its gate being coupled to a switching control signal SW2-A. The second antenna switching element 78 is coupled between the antenna port 22 and the second BAW delay line 28, with its gate being coupled to a switching control signal SW2-B.

The second antenna switch 54 further includes a third antenna switching element 80 and a fourth antenna switching element 82, each of which may be a MOSFET or another appropriate transistor. The third antenna switching element 80 is coupled between the load impedance 50 and the second BAW delay line 28, with its gate being coupled to the switching control signal SW2-A. The fourth antenna switching element 82 is coupled between the load impedance 50 and the first BAW delay line 26, with its gate being coupled to the switching control signal SW2-B.

The switching control signals SW2-A and SW2-B enable simultaneous switching of the first antenna switch 52 and the second antenna switch 54. Generally, the switching control signal SW2-B is a logical inverse of the switching control signal SW2-A (with logic high being above a switching threshold of the antenna switching elements 76, 78, 80, 82 and logic low being below the switching threshold). In this regard, when the switching control signal SW2-A is high and the switching control signal SW2-B is low, the first antenna switching element 76 and the third antenna switching element 80 are active while the second antenna switching element 78 and the fourth antenna switching element 82 are inactive. Accordingly, the first antenna switch 52 couples the antenna port 22 to the first BAW delay line 26 and the second antenna switch 54 couples the load impedance 50 to the second BAW delay line 28.

When the switching control signal SW2-B is high and the switching control signal SW2-A is low, the second antenna switching element 78 and the fourth antenna switching element 82 are active while the first antenna switching element 76 and the third antenna switching element 80 are inactive. Accordingly, the first antenna switch 52 couples the antenna port 22 to the second BAW delay line 28 and the second antenna switch 54 couples the load impedance 50 to the first BAW delay line 26.

The switching control signals SW1-A, SW1-B, SW2-A, and SW2-B can be received from control circuitry. In some examples, the control circuitry may be separate from the circulator circuit 12, as depicted in FIG. 4. In other examples, the control circuitry may be another component of the circulator circuit 12. The control circuitry may generate the switching control signals SW1-A, SW1-B, SW2-A, and SW2-B such that the circulator circuit 12 performs sequential switching operations, such as described with respect to FIGS. 2A-2H. Accordingly, the control circuitry can include a processor, a digital signal processor (DSP), an application specific integrated circuit (ASIC), a field programmable gate array (FPGA), or other programmable logic device, a discrete gate or transistor logic, discrete hardware components, or any combination thereof designed to perform the functions described herein.

Figure 5A:
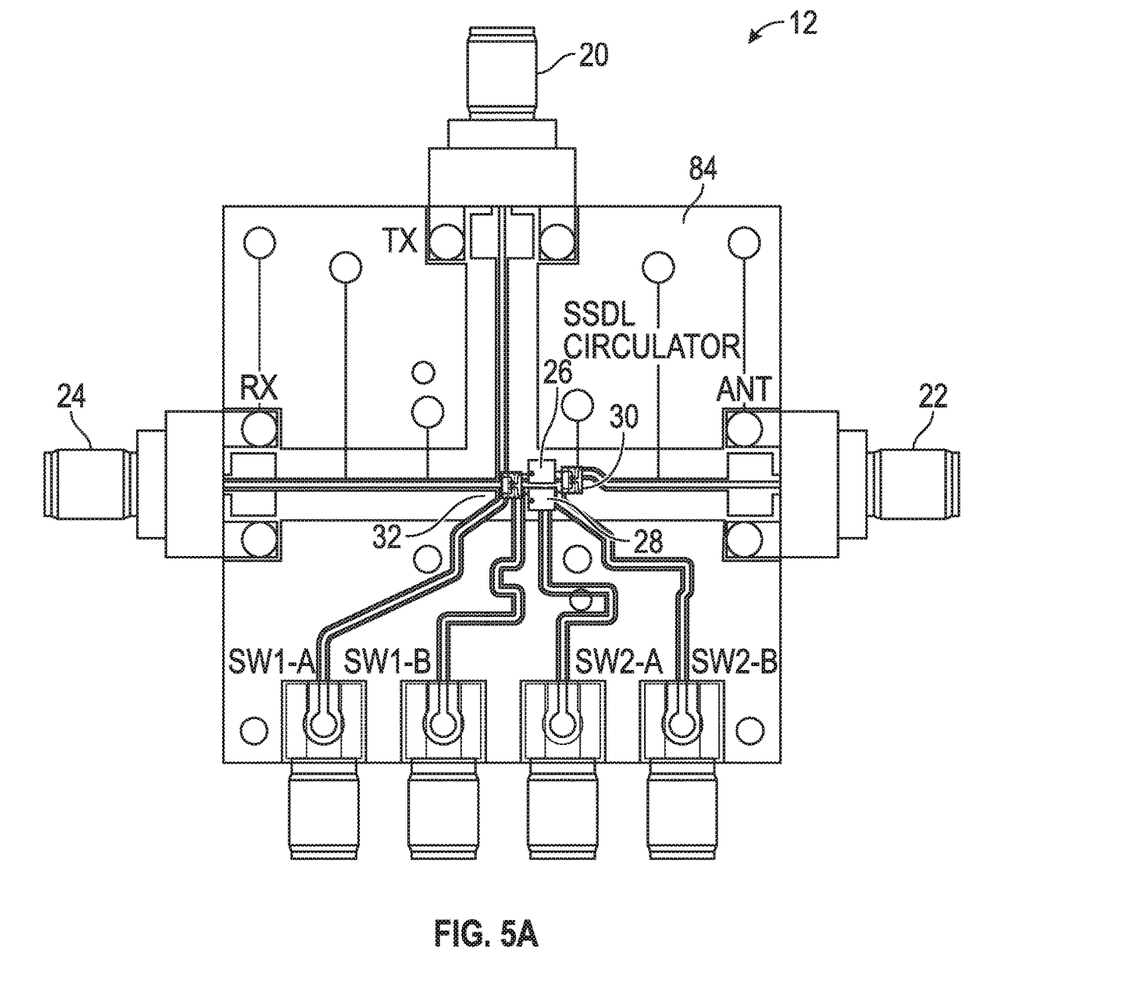
FIG. 5A illustrates a circuit layout of the exemplary BAW delay line-based circulator circuit of FIGS. 3C and 4.

FIG. 5A illustrates a circuit layout of the exemplary BAW delay line-based circulator circuit 12 of FIGS. 3C and 4. The circulator circuit 12 includes a circuit substrate 84 on which components are disposed, including the TX port 20, the antenna port 22, and the RX port 24. In an exemplary aspect, the circuit substrate 84 is a printed circuit board, flexible circuit board, or similar substrate on which the antenna switching circuitry 30, the TX/RX switching circuitry 32, the first BAW delay line 26, and the second BAW delay line 28 are mounted. In another example, the circuit substrate 84 may be a semiconductor substrate (e.g., a gallium arsenide (GaAs) substrate or a gallium nitride (GaN) substrate) on which the printed circuit board, flexible circuit board, or similar substrate on which the antenna switching circuitry 30, the TX/RX switching circuitry 32, the first BAW delay line 26, and the second BAW delay line 28 are formed.

Figure 5B:
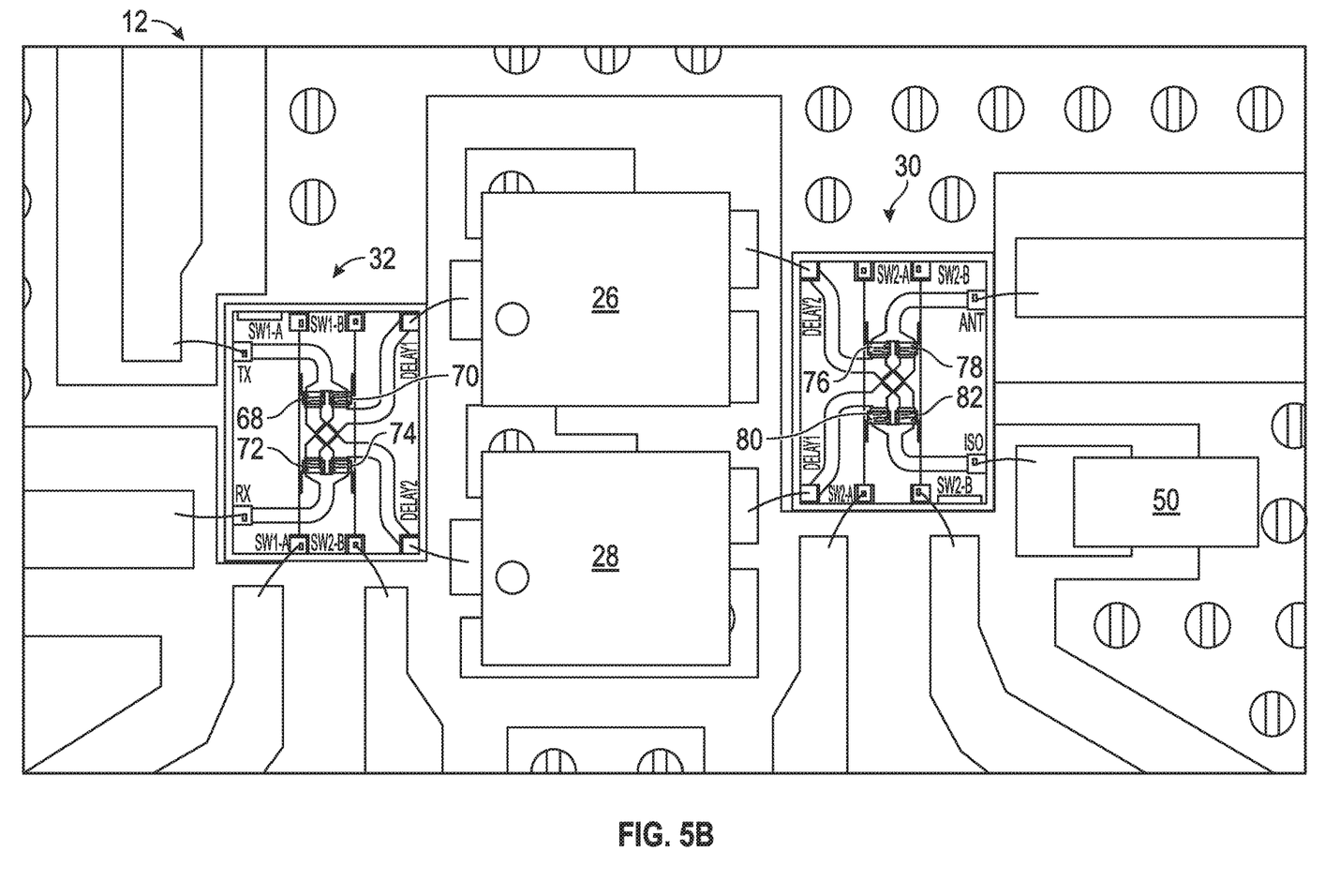
FIG. 5B illustrates an additional view of the circuit layout of FIG. 5A.

Turning to FIG. 5B, an additional view of the circuit layout of FIG. 5A is illustrated. As depicted in FIG. 5B, the circulator circuit 12 includes the first BAW delay line 26 and the second BAW delay line 28 between the antenna switching circuitry 30 and the TX/RX switching circuitry 32. In greater detail, the TX/RX switching circuitry 32 includes the first TX switching element 68 and the second TX switching element 70. The first TX switching element 68 is coupled between the TX port 20 (see FIG. 5A) and the second BAW delay line 28, with its gate being coupled to the switching control signal SW1-A. The second TX switching element 70 is coupled between the TX port 20 and the first BAW delay line 26, with its gate being coupled to the switching control signal SW1-B.

The TX/RX switching circuitry 32 further includes the first RX switching element 72 and the second RX switching element 74. The first RX switching element 72 is coupled between the RX port 24 (see FIG. 5A) and the first BAW delay line 26, with its gate being coupled to the switching control signal SW1-A. The second RX switching element 74 is coupled between the RX port 24 and the second BAW delay line 28, with its gate being coupled to the switching control signal SW1-B. The switching control signals SW1-A and SW1-B may enable simultaneous switching of the first TX switching element 68, the second TX switching element 70, the first RX switching element 72, and the second RX switching element 74 as described above with respect to FIGS. 2A-2H and 4.

The antenna switching circuitry 30 includes the first antenna switching element 76 and the second antenna switching element 78. The first antenna switching element 76 is coupled between the antenna port 22 (see FIG. 5A) and the first BAW delay line 26, with its gate being coupled to the switching control signal SW2-A. The second antenna switching element 78 is coupled between the antenna port 22 and the second BAW delay line 28, with its gate being coupled to the switching control signal SW2-B.

The antenna switching circuitry 30 further includes the third antenna switching element 80 and the fourth antenna switching element 82. The third antenna switching element 80 is coupled between the load impedance 50 and the second BAW delay line 28, with its gate being coupled to the switching control signal SW2-A. The fourth antenna switching element 82 is coupled between the load impedance 50 and the first BAW delay line 26, with its gate being coupled to the switching control signal SW2-B. The switching control signals SW2-A and SW2-B may enable simultaneous switching of the first antenna switching element 76, the second antenna switching element 78, the third antenna switching element 80, and the fourth antenna switching element 82 as described above with respect to FIGS. 2A-2H and 4.

In an exemplary aspect, the antenna switching circuitry 30 and the TX/RX switching circuitry 32 may be formed with GaAs and/or GaN transistors in order to have a higher switching speed (e.g., lower switching time) to enable a shorter signal delay time τ for the first BAW delay line 26 and the second BAW delay line 28. For example, the switching time of the antenna switching circuitry 30 and the TX/RX switching circuitry 32 using GaAs or GaN may be between 0.5 nanoseconds (ns) and 2 ns. In higher power circulator circuit 12 applications, the switching time may be between 2 ns and 50 ns.

Figure 6:
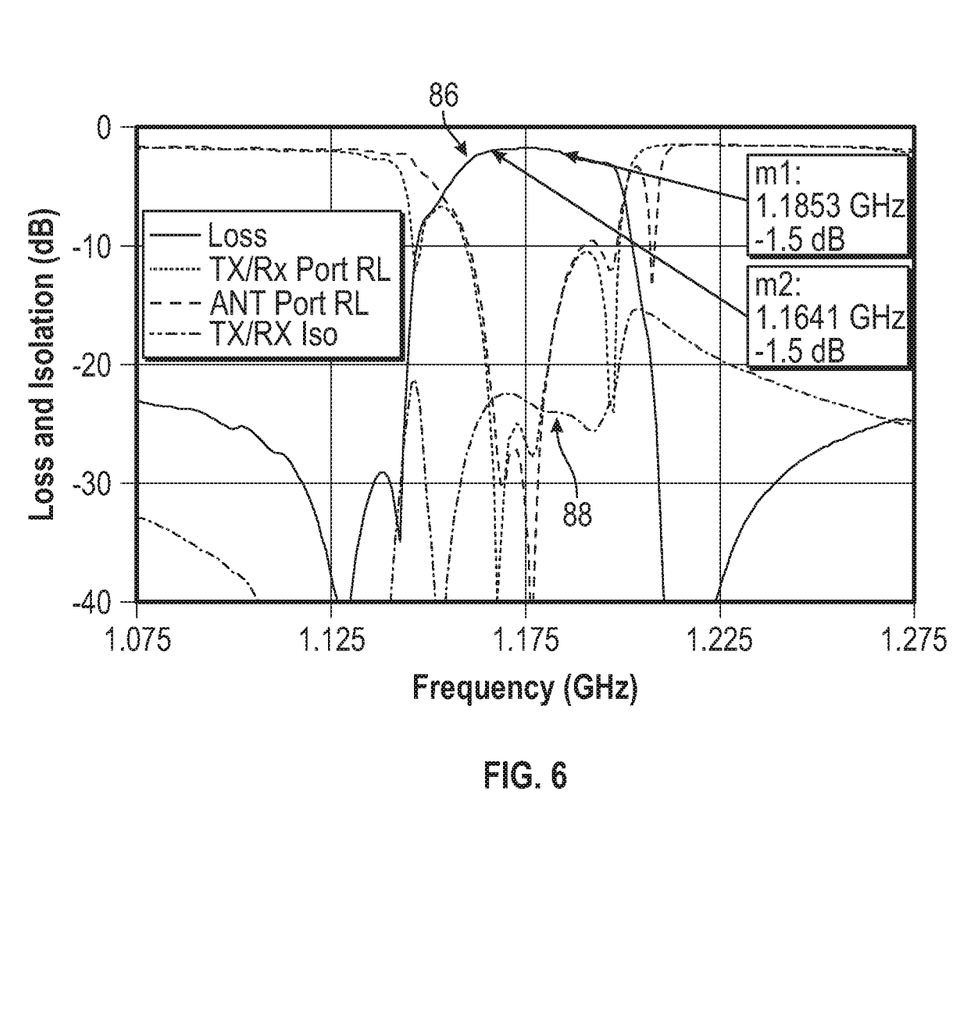
FIG. 6 illustrates response characteristics of the exemplary BAW delay line-based circulator circuit of FIGS. 4-5B.

In this regard, FIG. 6 illustrates response characteristics of the exemplary BAW delay line-based circulator circuit 12 of FIGS. 4-5B. The SSDL lines of the circulator circuit 12 incorporate the first BAW delay line 26 and the second BAW delay line 28. In an exemplary aspect, the signal delay time τ of each BAW delay line 26, 28 can exceed 10 ns. In an exemplary embodiment, the first BAW delay line 26 and the second BAW delay line 28 are flip-chip mounted on a GaAs or GaN switch monolithic microwave integrated circuit (MMIC) which is 3.00 millimeters (mm)×2.50 mm in size (e.g., footprint as shown in FIG. 5B). As further illustrated in FIG. 6, this implementation provides between 13 ns and 16 ns of delay over a 20 megahertz (MHz) bandwidth with between 1.25 decibels (dB) and 1.75 dB of insertion loss 86 and greater than 20 dB of isolation 88 between the TX port 20 and the RX port 24.

In addition, the circulator circuit 12 incorporating BAW delay lines 26, 28 may achieve a higher Q factor (resulting in lower insertion loss), operate over a larger RF bandwidth, and handle larger power signals. For example, with a signal delay time τ greater than 10 ns, the footprint of the first BAW delay line 26 and the second BAW delay line 28 can be between 1.50 mm×1.50 mm and 2.25 mm×2.25 mm in size. The circulator circuit 12 can operate over a RF bandwidth up to 10 GHz. In addition, the circulator circuit 12 can provide between 1.0 and 1.5 dB of insertion loss while providing between 30 dB and 60 dB of isolation between the TX port 20 and the RX port 24.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor-based circulator circuit, comprising:
    a transmit (TX) port;
    a receive (RX) port;
    an antenna port;
    a first bulk acoustic wave (BAW) delay line;
    a second BAW delay line;
    antenna switching circuitry coupled between the antenna port, the first BAW delay line, and the second BAW delay line and configured to selectively connect the antenna port to the first BAW delay line or the second BAW delay line; and
    TX/RX switching circuitry configured to:
        selectively connect the TX port to the first BAW delay line or the second BAW delay line; and
        selectively connect the RX port to the first BAW delay line or the second BAW delay line;
    wherein each of the first BAW delay line and the second BAW delay line introduces a signal delay time which is greater than a switching time of the antenna switching circuitry.

2. The semiconductor-based circulator circuit of claim 1, wherein the semiconductor-based circulator circuit is a full duplex circulator.

3. The semiconductor-based circulator circuit of claim 1, wherein the TX/RX switching circuitry comprises:
    a TX switch coupled between the TX port, the first BAW delay line, and the second BAW delay line and configured to selectively connect the TX port to the first BAW delay line or the second BAW delay line; and
    a RX switch coupled between the RX port, the first BAW delay line, and the second BAW delay line and configured to selectively connect the RX port to the first BAW delay line or the second BAW delay line.

4. The semiconductor-based circulator circuit of claim 3, wherein the TX switch and the RX switch are simultaneously switched, such that:
when the TX switch couples the TX port to the first BAW delay line, the RX switch couples the RX port to the second BAW delay line; and
when the TX switch couples the TX port to the second BAW delay line, the RX switch couples the RX port to the first BAW delay line.

5. The semiconductor-based circulator circuit of claim 1, wherein the switching time of the antenna switching circuitry is between 0.5 nanoseconds (ns) and 50 ns.

6. The semiconductor-based circulator circuit of claim 1, wherein the antenna switching circuitry comprises a semiconductor switch.

7. The semiconductor-based circulator circuit of claim 6, wherein the antenna switching circuitry comprises a gallium arsenide (GaAs) transistor-based switch.

8. The semiconductor-based circulator circuit of claim 6, wherein the antenna switching circuitry comprises a gallium nitride (GaN) transistor-based switch.

9. The semiconductor-based circulator circuit of claim 1, wherein the antenna switching circuitry comprises a silicon-on-insulator (SOI).

10. The semiconductor-based circulator circuit of claim 1, wherein each of the first BAW delay line and the second BAW delay line comprise a BAW resonator.

11. The semiconductor-based circulator circuit of claim 1, wherein:
the TX port is coupled to TX processing circuitry; and
the RX port is coupled to RX processing circuitry.

12. A radio frequency (RF) transceiver, comprising:
transmit (TX) processing circuitry;
receive (RX) processing circuitry;
an antenna; and
a circulator circuit configured to simultaneously exchange a RX signal between the antenna and the RX processing circuitry and exchange a TX signal between the TX processing circuitry and the antenna, comprising:
a first bulk acoustic wave (BAW) delay line;
a second BAW delay line;
antenna switching circuitry coupled between the antenna, the first BAW delay line, and the second BAW delay line; and
TX/RX switching circuitry coupled between the TX processing circuitry, the RX processing circuitry, the first BAW delay line, and the second BAW delay line;
wherein each of the first BAW delay line and the second BAW delay line introduces a signal delay time which is greater than a first switching time of the antenna switching circuitry and a second switching time of the TX/RX switching circuitry.

13. The RF transceiver of claim 12, wherein at a first time:
the antenna switching circuitry couples the RX signal from the antenna to the first BAW delay line; and
the TX/RX switching circuitry couples the TX signal from the TX processing circuitry to the second BAW delay line.

14. The RF transceiver of claim 13, wherein at a second time after the first time:
the antenna switching circuitry couples the TX signal from the first BAW delay line to the antenna; and
the TX/RX switching circuitry couples the RX signal from the second BAW delay line to the RX processing circuitry.

15. The RF transceiver of claim 14, wherein the signal delay time occurs between the first time and the second time.

16. A method of operating a radio frequency (RF) transceiver, comprising:
coupling transmit (TX) processing circuitry to a first bulk acoustic wave (BAW) delay line;
coupling an antenna to a second BAW delay line using antenna switching circuitry;
after a first delay, coupling the antenna to the first BAW delay line using the antenna switching circuitry; and
after the first delay, coupling receive (RX) processing circuitry to the second BAW delay line;
wherein each of the first BAW delay line and the second BAW delay line introduces a signal delay time which is greater than a switching time of the antenna switching circuitry.

17. The method of claim 16, further comprising:
storing a first TX signal in the first BAW delay line during the first delay; and
storing a first RX signal in the second BAW delay line during the first delay.

18. The method of claim 17, further comprising:
storing a second TX signal in the first BAW delay line during a second delay after the first delay;
storing a second RX signal in the first BAW delay line during the second delay after the first delay;
after the second delay, coupling the antenna to the first BAW delay line; and
after the second delay, coupling the RX processing circuitry to the first BAW delay line.

19. The method of claim 17, further comprising:
storing a second TX signal in the second BAW delay line during a second delay after the first delay;
storing a second RX signal in the first BAW delay line during the second delay after the first delay;
after the second delay, coupling the antenna to the second BAW delay line; and
after the second delay, coupling the RX processing circuitry to the first BAW delay line.

* * * * *